US011077536B2

(12) United States Patent
Yang et al.

(10) Patent No.: US 11,077,536 B2
(45) Date of Patent: *Aug. 3, 2021

(54) SLURRY DISTRIBUTION DEVICE FOR CHEMICAL MECHANICAL POLISHING

(71) Applicant: Applied Materials, Inc., Santa Clara, CA (US)

(72) Inventors: Yen-Chu Yang, Santa Clara, CA (US); Stephen Jew, San Jose, CA (US); Jianshe Tang, San Jose, CA (US); Haosheng Wu, Santa Clara, CA (US); Shou-Sung Chang, Mountain View, CA (US); Paul D. Butterfield, San Jose, CA (US); Alexander John Fisher, Santa Clara, CA (US); Bum Jick Kim, Irvine, CA (US)

(73) Assignee: Applied Materials, Inc., Santa Clara, CA (US)

( * ) Notice: Subject to any disclaimer, the term of this patent is extended or adjusted under 35 U.S.C. 154(b) by 107 days.

This patent is subject to a terminal disclaimer.

(21) Appl. No.: 15/626,936

(22) Filed: Jun. 19, 2017

(65) Prior Publication Data

US 2017/0368664 A1    Dec. 28, 2017

Related U.S. Application Data

(60) Provisional application No. 62/354,563, filed on Jun. 24, 2016, provisional application No. 62/510,532, filed on May 24, 2017.

(51) Int. Cl.
*B24B 57/02* (2006.01)
*B24B 37/10* (2012.01)
*H01L 21/67* (2006.01)

(52) U.S. Cl.
CPC .............. *B24B 57/02* (2013.01); *B24B 37/10* (2013.01); *H01L 21/6708* (2013.01); *H01L 21/67075* (2013.01)

(58) Field of Classification Search
None
See application file for complete search history.

(56) References Cited

U.S. PATENT DOCUMENTS 3,028,711 A    4/1962    Campbell et al.
3,261,510 A    7/1966    Day et al.
(Continued)

FOREIGN PATENT DOCUMENTS

CN        1672876        9/2005
CN        204819116      12/2015
(Continued)

OTHER PUBLICATIONS

International Search Report and Written Opinion in International Application No. PCT/US2017/038184, dated Sep. 14, 2017, 8 pages.
(Continued)

*Primary Examiner* — Sylvia MacArthur
(74) *Attorney, Agent, or Firm* — Fish & Richardson P.C.

(57) ABSTRACT

An apparatus for chemical mechanical polishing includes a rotatable platen having a surface to support a polishing pad, a carrier head to hold a substrate in contact with the polishing pad, and a polishing liquid distribution system. The polishing liquid distribution system includes a dispenser positioned to deliver a polishing liquid to a portion of a polishing surface of the polishing pad, and a first barrier positioned before the portion of the polishing surface and configured to block used polishing liquid from reaching the portion of the polishing surface. The first barrier includes a solid first body having a first flat bottom surface and having
(Continued)

a first leading surface configured to contact the used polishing liquid.

8 Claims, 5 Drawing Sheets

(56) References Cited

U.S. PATENT DOCUMENTS

| | | | |
|---|---|---|---|
| 3,848,366 A | 11/1974 | David | |
| 4,435,247 A | 3/1984 | Basi et al. | |
| 4,513,894 A | 4/1985 | Doyle et al. | |
| 4,600,469 A | 7/1986 | Fusco et al. | |
| 4,850,157 A | 7/1989 | Homstrand | |
| 4,910,155 A | 3/1990 | Cote et al. | |
| 5,234,867 A | 8/1993 | Schultz et al. | |
| 5,245,796 A | 9/1993 | Miller et al. | |
| 5,246,525 A | 9/1993 | Sato | |
| 5,291,693 A | 3/1994 | Nguyen | |
| 5,709,593 A | 1/1998 | Guthrie et al. | |
| 5,893,753 A * | 4/1999 | Hempel, Jr. | B08B 1/007 134/198 |
| 6,280,297 B1 | 8/2001 | Tolles | |
| 6,361,647 B1 * | 3/2002 | Halley | B24B 37/042 156/345.1 |
| 6,528,128 B2 | 3/2003 | Ito et al. | |
| 6,666,755 B1 * | 12/2003 | Taylor | B24B 21/10 451/285 |
| 6,712,678 B1 | 3/2004 | Wada et al. | |
| 6,824,448 B1 * | 11/2004 | Vines | B24B 53/017 451/36 |
| 8,197,306 B2 | 6/2012 | Borucki et al. | |
| 8,845,395 B2 | 9/2014 | Borucki et al. | |
| 9,296,088 B2 | 3/2016 | Borucki et al. | |
| 9,339,914 B2 * | 5/2016 | Yavelberg | B24B 37/34 |
| 2002/0068508 A1 | 6/2002 | Lefky | |
| 2003/0012889 A1 * | 1/2003 | Ito | B05C 5/002 427/512 |
| 2003/0070695 A1 * | 4/2003 | Emami | B08B 3/02 134/33 |
| 2005/0221724 A1 | 10/2005 | Terada et al. | |
| 2009/0264049 A1 | 10/2009 | Chen et al. | |
| 2014/0011432 A1 | 1/2014 | Borucki et al. | |
| 2015/0190899 A1 | 7/2015 | Liu | |
| 2016/0001418 A1 | 1/2016 | Terada | |
| 2016/0016283 A1 | 1/2016 | Butterfield | |
| 2016/0114459 A1 | 4/2016 | Butterfield et al. | |
| 2016/0167195 A1 | 6/2016 | Diao | |
| 2017/0368663 A1 | 12/2017 | Yang et al. | |
| 2017/0368664 A1 * | 12/2017 | Yang | B24B 37/10 |

FOREIGN PATENT DOCUMENTS

| | | |
|---|---|---|
| KR | 101613462 | 4/2016 |
| TW | 464920 | 11/2001 |

OTHER PUBLICATIONS

CN Office Action in Chinese Application No. 201780039337.5, dated May 19, 2020, 13 pages (with English translation).

* cited by examiner

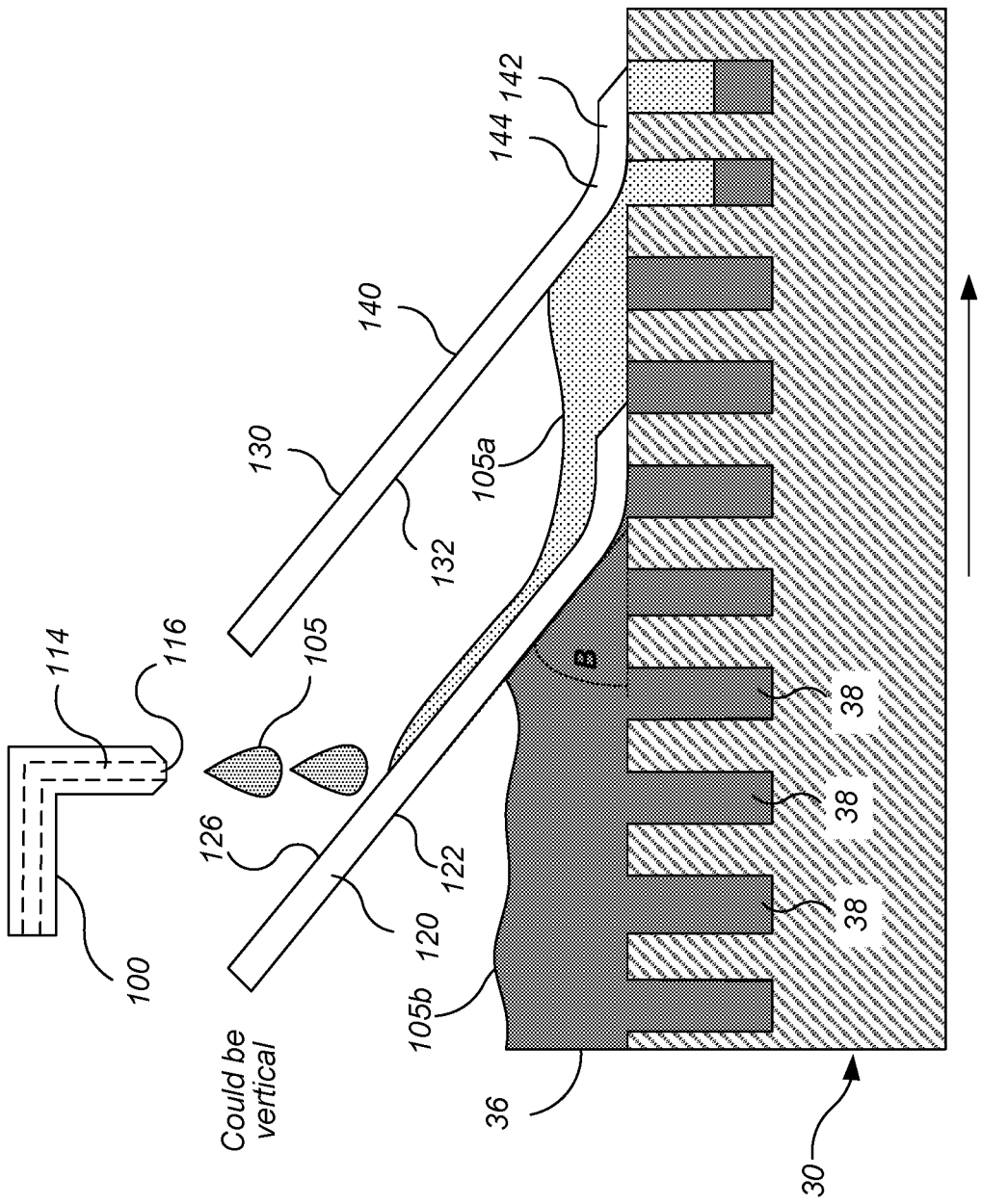

SLURRY DISTRIBUTION DEVICE FOR CHEMICAL MECHANICAL POLISHING

CROSS-REFERENCE TO RELATED APPLICATIONS

This application claims priority to U.S. Provisional Application Ser. No. 62/354,563, filed on Jun. 24, 2016, and claims priority to U.S. Provisional Application Ser. No. 62/510,532, filed on May 24, 2017, the disclosures of which are incorporated by reference.

TECHNICAL FIELD

The present disclosure relates to distribution of a polishing liquid, e.g., an abrasive slurry, during chemical mechanical polishing of a substrate.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a conductive filler layer on a patterned insulative layer to fill the trenches or holes in the insulative layer. The filler layer is then polished until the raised pattern of the insulative layer is exposed. After planarization, the portions of the conductive filler layer remaining between the raised pattern of the insulative layer form vias, plugs and lines that provide conductive paths between thin film circuits on the substrate. Planarization can also be used to smooth and remove, to a desired thickness, an insulative later that overlies a patterned conductive layer.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad.

SUMMARY

In one aspect, an apparatus for chemical mechanical polishing includes a rotatable platen having a surface to support a polishing pad, a carrier head to hold a substrate in contact with the polishing pad, and a polishing liquid distribution system. The polishing liquid distribution system includes a dispenser positioned to deliver a polishing liquid to a portion of a polishing surface of the polishing pad, and a first barrier positioned before the portion of the polishing surface and configured to block used polishing liquid from reaching the portion of the polishing surface.

Implementations of may include one or more of the following features.

The first barrier may be configured to contact the polishing surface in operation. A first actuator may be configured to adjust a height of the first barrier relative to and/or a pressure of the first barrier on the polishing surface. The first barrier may include a first wiper blade. A leading edge of the first wiper blade may be oriented at an acute angle relative to the polishing surface. The first wiper blade may include a first portion having the acute angle and a second portion oriented parallel to the polishing surface. The dispenser may be positioned to deliver the polishing liquid onto a trailing surface of the first wiper blade. The dispenser may be positioned to deliver the polishing liquid to a section of the trailing surface on a side of the first wiper blade that is closer to a center of the platen.

A second barrier may be positioned after the dispenser and may be configured to spread fresh polishing liquid delivered by the dispenser to the portion of the polishing surface. The second barrier may be configured to contact the polishing surface in operation. A second actuator may be configured to adjust a height of the second barrier relative to and/or a pressure of the second barrier on the polishing surface. The second barrier may include a second wiper blade. A leading edge of the second wiper blade may be oriented at an acute angle relative to the polishing surface. The first barrier may be positioned parallel to the second barrier. The first barrier may extend to an edge of the platen and the second barrier may be spaced from the edge of the platen. The second barrier may be positioned higher than or press with lower pressure on the polishing pad than the first barrier.

An actuator may be configured to sweep the first barrier and/or the second barrier laterally across the polishing pad. A reservoir may hold the polishing liquid, the dispenser may be fluidically coupled to the reservoir, and the polishing liquid may be an abrasive slurry.

In another aspect, an apparatus for chemical mechanical polishing includes a rotatable platen having a surface to support a polishing pad, a carrier head to hold a substrate in contact with the polishing pad, and a polishing liquid distribution system. The polishing liquid distribution system includes a dispenser positioned to deliver a polishing liquid to a portion of a polishing surface of the polishing pad, and a first barrier positioned before the portion of the polishing surface and configured to block used polishing liquid from reaching the portion of the polishing surface. A leading surface of the first barrier curves between an inner end of the first barrier closer to a center of the platen and an outer end of the first barrier closer to an edge of the platen.

Implementations may include one or more of the following features.

The platen may be configured to rotate to provide a direction of motion below the first barrier, and the leading surface of the first barrier may be curved such that such that a concave side of the leading surface of the first barrier faces in the direction of motion.

A second barrier may be positioned after the dispenser and may be configured to spread fresh polishing liquid delivered by the dispenser to the portion of the polishing surface. A leading surface of the second barrier may be curved between an inner end of the second barrier closer to a center of the platen and an outer end of the second barrier closer to an edge of the platen. The leading surface of the second barrier may be curved such that such that a concave side of the leading surface of the second barrier faces in the direction of motion. A radius of curvature of the second barrier may be less than a radius of curvature of the first barrier.

In another aspect, an apparatus for chemical mechanical polishing includes a rotatable platen having a surface to support a polishing pad, a carrier head to hold a substrate in contact with the polishing pad, and a polishing liquid distribution system. The polishing liquid distribution system includes a dispenser positioned to deliver a polishing liquid to a portion of a polishing surface of the polishing pad, and a first barrier positioned before the portion of the polishing surface and configured to block used polishing liquid from reaching the portion of the polishing surface. The first barrier includes a solid first body having a first flat bottom surface and having a first leading surface configured to contact the used polishing liquid.

Implementations may include one or more of the following features.

The body may have a width along a direction of motion of the polishing pad below the first barrier greater than a height of the first body perpendicular to the polishing surface.

A splash guard may project from the first leading surface. The first leading surface of the first body of the first barrier may be substantially vertical and the splash guard may project substantially horizontally.

A second barrier may be positioned after the dispenser and may be configured to spread fresh polishing liquid delivered by the dispenser to the portion of the polishing surface. The second barrier may include a solid second body having a second flat bottom surface and having a second leading surface configured to contact the fresh polishing liquid. The second leading surface may be oriented at an acute angle relative to the polishing surface. The leading surface of the first body of the first barrier may be substantially vertical. The first barrier may extend to an edge of the platen and the second barrier may be spaced from the edge of the platen. The second barrier may be positioned higher than or press with lower pressure on the polishing pad than the first barrier.

In another aspect, an apparatus for chemical mechanical polishing includes a rotatable platen having a surface to support a polishing pad, a carrier head to hold a substrate in contact with the polishing pad, and a polishing liquid distribution system. The polishing liquid distribution system includes a dispenser positioned to deliver a polishing liquid to a portion of a polishing surface of the polishing pad, a first barrier positioned before the portion of the polishing surface and configured to block used polishing liquid from reaching the portion of the polishing surface, a second barrier positioned after the dispenser and configured to spread fresh polishing liquid delivered by the dispenser to the portion of the polishing surface, and a common actuator coupled to the first barrier and the second barrier to adjust a lateral position of the first barrier and the second barrier on the polishing surface.

Implementations may include one or more of the following features.

The common lateral actuator may include an arm having a first end coupled to the first barrier and the second barrier and a second end coupled to a rotary actuator to sweep the arm laterally over the platen. A first actuator may be coupled between the first barrier and the arm and a second actuator may be coupled between the second barrier and the arm. The first actuator may be configured to adjust a height of the first barrier relative to the polishing surface and/or a pressure of the first barrier on the polishing surface, and the second actuator may be configured to independently adjust a height of the second barrier relative to the polishing surface and/or a pressure of the second barrier on the polishing surface.

Certain implementations can include one or more of the following advantages. Polishing uniformity can be improved. Defectivity can be reduced. Polishing can be less sensitive to pattern density, and dishing and erosion can be reduced. Slurry usage can be decreased, thus reducing cost of ownership. Polishing rates can be improved, or polishing pressure can be reduced while maintaining the polishing rate.

The details of one or more implementations are set forth in the accompanying drawings and the description below. Other aspects, features and advantages will be apparent from the description and drawings, and from the claims.

BRIEF DESCRIPTION OF DRAWINGS

FIG. 3 is a schematic side view, partially cross-sectional, of a slurry distribution system.

Like reference symbols in the various drawings indicate like elements.

DETAILED DESCRIPTION

One problem in chemical mechanical problem is sensitivity to pattern density, e.g., as exhibited by erosion and dishing. By positioning a barrier to block used slurry from passing back beneath the substrate, the polishing process can be less sensitive to pattern density, and dishing and erosion can be reduced.

Another problem in chemical mechanical polishing is defectivity. A potential contributor to defectivity is polishing by-products. A device that blocks used polishing liquid from returning to the region below the carrier head can help reduce the polishing by-products from reaching the substrate during polishing.

Another problem in chemical mechanical polishing is within-wafer non-uniformity (WIWNU). A potential contributor to polishing non-uniformity is non-uniform distribution of slurry to the interface between the substrate and the polishing pad. By placing a slurry spreader in contact with the polishing pad, slurry can be spread across the polishing pad in a more uniform manner.

Figure 1:
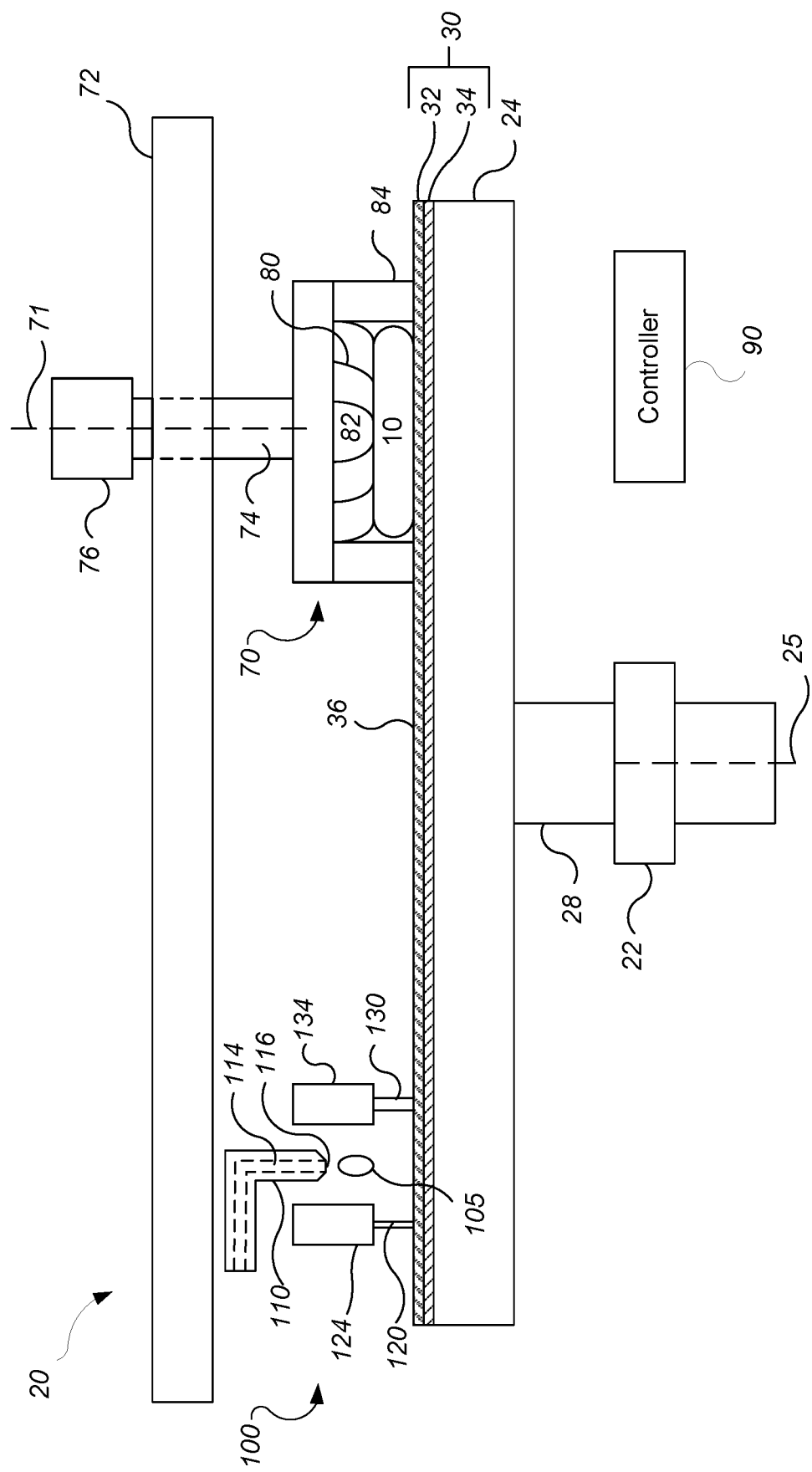
FIG. 1 is a schematic side view, partially cross-sectional, of a chemical mechanical polishing station that includes a slurry distribution system.

FIG. 1 illustrates an example of a polishing station 20 of a chemical mechanical polishing apparatus. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24.

The polishing pad 30 can be a two-layer polishing pad with a polishing layer 32 and a softer backing layer 34. A plurality of grooves 38 can be formed in the polishing surface 36 of the polishing pad 30 (see FIG. 3).

The polishing station 22 can include a pad conditioner apparatus 40 with a conditioning disk 42 to maintain the condition of the polishing pad 30 (see FIG. 2). The conditioning disk 42 may be positioned at the end of an arm 44 that can move the disk 42 radially across the polishing pad 30.

The carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel or track 72; or by rotational oscillation of the carousel itself. In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head can also include a retaining ring 84 to hold the substrate.

A polishing liquid distribution system 100 delivers and spreads a polishing liquid, e.g., an abrasive slurry, on the surface of the polishing pad 30. The polishing liquid distribution system 100 can also prevent used polishing liquid from returning to the substrate 10.

Figure 2A:
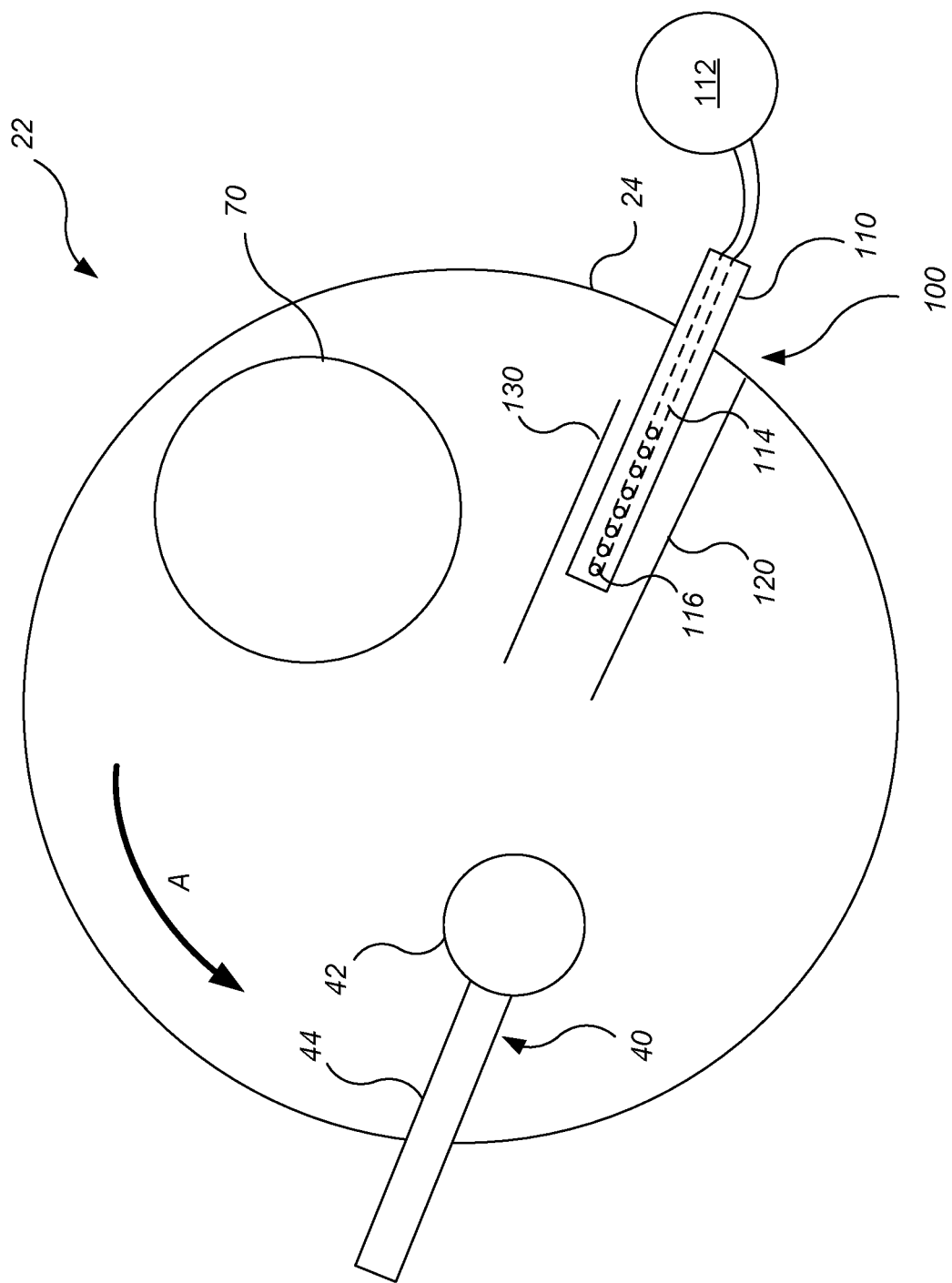
FIG. 2A is a schematic top view of the chemical mechanical polishing station of FIG. 1.

Referring to FIGS. 1 and 2A, the polishing liquid distribution system 100 includes a dispenser 110 to deliver the polishing liquid 105 from a reservoir 112 to the polishing pad 30. The dispenser 110 includes one or more passages 114 having one or more ports 116 positioned over the polishing pad 30. For example, the dispenser 110 can include a rigid body through which the passage 114 extends, or the dispenser 110 can include flexible tubing supported by an arm. In either case, one or more holes or nozzles coupled to the passage 114 can provide the ports 116.

The polishing liquid distribution system 100 also includes a first barrier 120 to block polishing liquid that has already passed under the carrier head 70 or the conditioner disk 42 from reaching the location on the polishing pad 30 where the dispenser 110 delivers the fresh polishing liquid. The first barrier 120 is positioned "before"—relative to the direction of motion of the pad—the location on the polishing pad where the dispenser 110 delivers the polishing liquid 105. For example, as shown in FIG. 2, if the platen 24 rotates counter-clockwise as shown by arrow A, then the first barrier 120 is positioned clockwise of the dispenser 110.

In some implementations, the first barrier 120 is positioned between the dispenser 110 and the conditioner 40 (or between the dispenser 110 and the carrier head 70 if there is no conditioner). In some implementations, the first barrier is positioned between the conditioner 40 and the carrier head 70.

In some implementations, the first barrier 120 is a body that contacts the surface 36 of the polishing pad 30 and generally blocks the polishing liquid from passing underneath, except for any used polishing liquid that may be present in the grooves 38 and/or a thin film of used polishing liquid 105. The body of the first barrier can simply rest on the polishing pad 30, or be positively pressed onto the polishing pad 30, e.g., by an actuator. In some implementations, the first barrier 120 is a body that sits slightly above the surface 36 of the polishing pad 30.

The first barrier 120 can be generally elongated body, e.g., a linear body (as shown in FIG. 2A), and can be oriented substantially perpendicular to the direction of motion of the platen 24, e.g., generally along a radius of the platen 24. Alternatively, the first barrier can be canted at substantial angle relative to the radius of the platen, e.g., 10-30°.

Figure 2B:
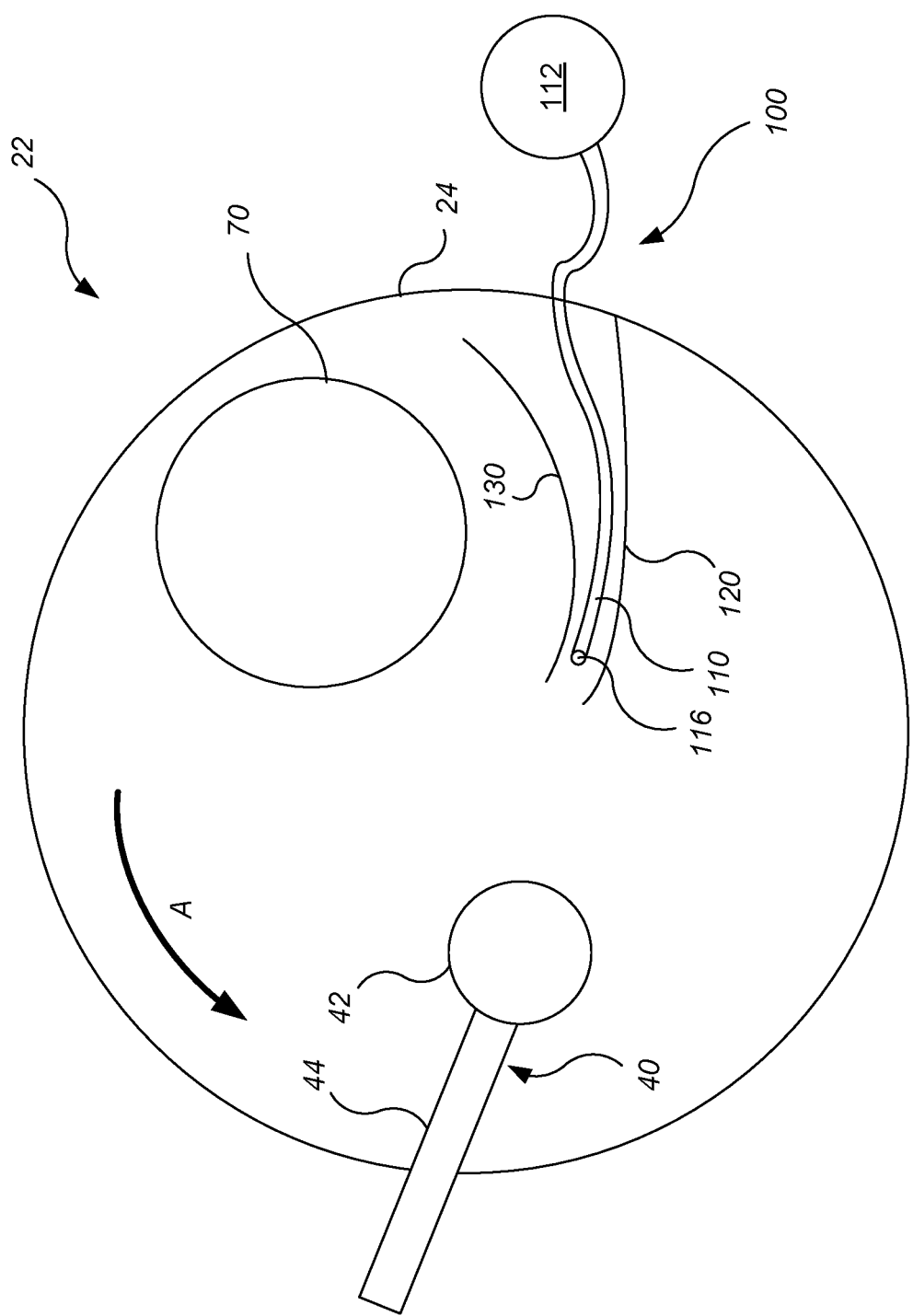
FIG. 2B is a schematic top view of another implementation of a chemical mechanical polishing station.

In some implementations, the first barrier 120 is a curved body, e.g., as shown in FIG. 2B. The barrier 120 can curve such that the end closer to the outer edge of the platen 24 is further along the direction of motion (shown by arrow A) than the end that is closer to the center of the platen. The first barrier 130 can curve such that the concave side faces in the direction of motion.

A leading surface of the first barrier 120 be oriented at an angle of 15 to 90 relative to the polishing surface 36 (see angle B in FIG. 3). In some implementations, the leading surface is slanted relative to the polishing surface, e.g., at an angle less than 90 degrees. In some implementations, the leading surface is oriented vertically, i.e., at a right angle relative to the polishing surface. The leading surface of the first barrier 120 can slope, from top to bottom, in the direction of motion of the polishing pad (see arrow A in FIG. 3).

In some implementations, the first barrier 120 is a wiper blade. The front surface of the wiper blade provides the leading surface of the first barrier 120. The wiper blade of the first barrier 120 can be formed of a flexible material, such as natural rubber or synthetic material of similar flexibility, e.g., a flexible plastic, or be formed of a rigid material, e.g., a rigid plastic, e.g., polyetheretherketone (PEEK) or polyphenylene sulfide (PPS).

Assuming the wiper blade is a sheet of uniform width, the wiper blade of the first barrier 120 can be positioned at an angle of 15 to 90 degrees relative to the polishing surface 36 (see angle B in FIG. 3). In some implementations, the wiper blade of the first barrier 120 is slanted relative to the polishing surface, e.g., at an angle less than 90 degrees. In some implementations, the wiper blade of the first barrier 120 is oriented vertically, i.e., at a right angle relative to the polishing surface. The wiper blade of the first barrier 120 can be oriented such that the wiper blade slopes, from top to bottom, in the direction of motion of the polishing pad (see arrow A in FIG. 3).

In some implementations, the first barrier 120 is suspended from a first actuator 124 that can control the vertical position of the first barrier 120 relative to the polishing surface 36 and/or the down force of the first barrier 120 against the polishing surface 36. Alternatively or in addition, the first actuator 124 can move the first barrier 130 laterally over the polishing pad 30, e.g., radially.

The polishing liquid distribution system 100 also includes a second barrier 130 to spread the fresh polishing liquid that has just been delivered by the dispenser 110 in an even film across the polishing surface 36. The second barrier 130 is positioned "after" the location on the polishing pad 30 where the dispenser 110 delivers the polishing liquid 105. For example, as shown in FIG. 2, if the platen 24 rotates counter-clockwise as shown by arrow A, then the second barrier 130 is positioned counter-clockwise of the dispenser 110. The second barrier 130 is positioned between the dispenser 110 and the carrier head 70.

In some implementations, the second barrier 130 is a body that contacts the surface 36 of the polishing pad 30 and generally blocks the polishing liquid from passing underneath, except for any polishing liquid that may be present in the grooves 38 and/or a thin film of polishing liquid 105. The body of the second barrier 130 can simply rest on the polishing pad 30, or be positively pressed onto the polishing pad 30, e.g., by an actuator. In some implementations, the second barrier 130 is a body that sits slightly above the surface 36 of the polishing pad 30, while still contacting the polishing liquid. For example, when the platen rotates, the body of the second barrier 130 could hydroplane on the polishing liquid. In either case, the second barrier 130 can help spread the fresh polishing liquid 105a more uniformly across the polishing pad 30.

In some implementations, the first barrier 120 is pressed into the polishing pad 30 at a greater pressure than the second barrier 130. In some implementations, the first barrier 120 contacts the polishing pad 30 whereas the second barrier 130 sits slightly above the surface 36 of the polishing pad 30 while still contacting the polishing liquid.

The second barrier 130 can be generally elongated body, e.g., a linear body, and can be oriented substantially perpendicular to the direction of motion of the platen 24, e.g., generally along a radius of the platen 24. Alternatively, the first barrier can be canted at an angle relative to the radius of the platen, e.g., 10-30°.

The second barrier 130 can be parallel to the first barrier 120. Alternatively, the second barrier 130 can canted at a greater angle relative to the radius of the platen than the first barrier 120.

In some implementations, the second barrier 130 is a curved body, e.g., as shown in FIG. 2B. The second barrier 130 can curve such that the end closer to the outer edge of the platen 24 is further along the direction of motion (shown by arrow A) than the end that is closer to the center of the platen. The second barrier 130 can curve such that the concave side faces in the direction of motion.

The second barrier 130 can be equidistant along its length from the first barrier 120. Alternatively, the radius of curvature of the second barrier 130 can less than the radius of curvature of the first barrier 120. This can result in the distance between the first barrier 120 and the second barrier 130 increasing along the radial direction toward the edge of the platen 24.

A leading surface of the second barrier 130 be oriented at an angle of 15 to 90 relative to the polishing surface 36. In some implementations, the leading surface of the second barrier is slanted relative to the polishing surface, e.g., at an angle less than 90 degrees. In some implementations, the leading surface of the second barrier is oriented vertically, i.e., at a right angle relative to the polishing surface. The leading surface of the second barrier 130 can slope, from top to bottom, in the direction of motion of the polishing pad (see arrow A in FIG. 3).

In some implementations, the second barrier 130 is a wiper blade. The front surface of the wiper blade provides the leading surface of the second barrier 130. The wiper blade of the second barrier 130 can be formed of a flexible material, such as natural rubber or synthetic material of similar flexibility, e.g., a flexible plastic, or be formed of a rigid material, e.g., a rigid plastic, e.g., polyetheretherketone (PEEK) or polyphenylene sulfide (PPS). In some implementations, the wiper blades of the first barrier 120 and the second barrier 130 are formed of the same material.

Assuming the wiper blade is a sheet of uniform width, the wiper blade of the second barrier 130 can be positioned to form an angle of 15 to 90 degrees between the leading face 132 of the wiper blade and the polishing surface 36 (see FIG. 3). Having the wiper blade of the second barrier 130 positioned at an angle can help push fresh slurry into the grooves, thus reducing the presence of used slurry that reaches the substrate.

In some implementations, the wiper blade of the second barrier 130 is slanted relative to the polishing surface, e.g., at an angle less than 90 degrees. In some implementations, the wiper blade of the second barrier 130 is oriented vertically, i.e., at a right angle relative to the polishing surface. The wiper blade of the second barrier 130 can be oriented such that the wiper blade slopes, from top to bottom, in the direction of motion of the polishing pad.

In some implementations, the wiper blades of the first barrier 120 and the second barrier 130 form the same angle with the polishing surface 36. In some implementations, the wiper blade of the first barrier 120 is oriented vertically whereas the wiper blade of the second barrier 130 slopes, from top to bottom, in the direction of motion of the polishing pad.

In some implementations, the second barrier 130 is suspended from a second actuator 134 that can control the vertical position of the second barrier 130 relative to the polishing surface 36 and/or the down force of the second barrier 130 against the polishing surface 36. Alternatively or in addition, the second actuator 134 can move the second barrier 130 laterally over the polishing pad 30, e.g., radially.

Each actuator 124, 134 can be a pneumatic actuator. For example, referring to FIG. 5, each actuator can include a lower body 150 to which the barrier, e.g., the wiper blade, is secured, an upper body 152 that is held by a support, e.g., an arm, and a bladder 154 trapped between the lower body 150 and the upper body 152. Inflation of the bladder 154 thus controls the vertical position of lower body 150 and the barrier 120, 130 and/or pressure of the barrier 120, 130 on the polishing pad. The bottom of the bladder can be secured, e.g., adhesively secured, to the lower body 150, and the top of the bladder can be secured, e.g., by clamping rims of the bladder, to the upper body 152. Either actuators can be another kind of actuator, e.g., a linear motor or piezoelectric actuator.

In some implementations, the first barrier 120 and the second barrier 130 are suspended from the same actuator.

Figure 4:
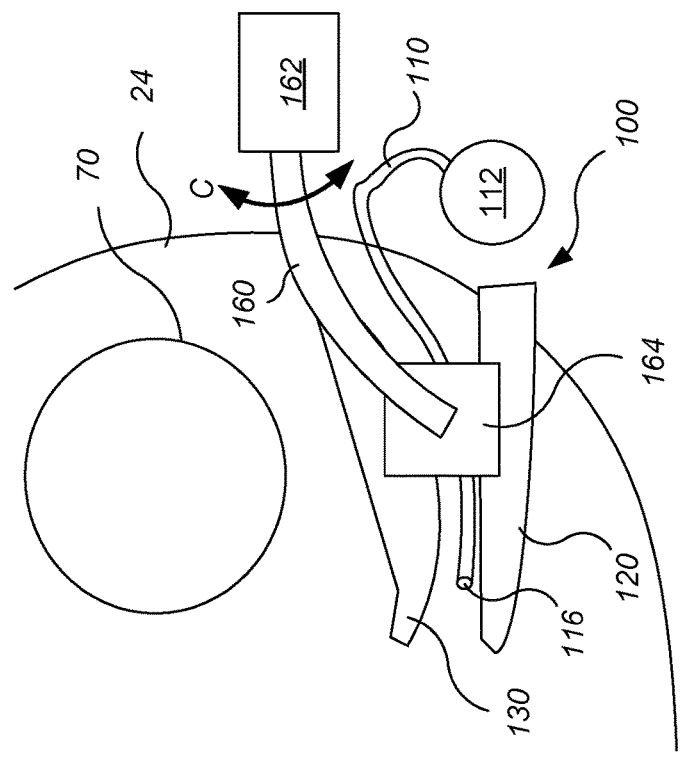
FIG. 4 is a schematic top view of a portion of a chemical mechanical polishing station.
Figure 5:
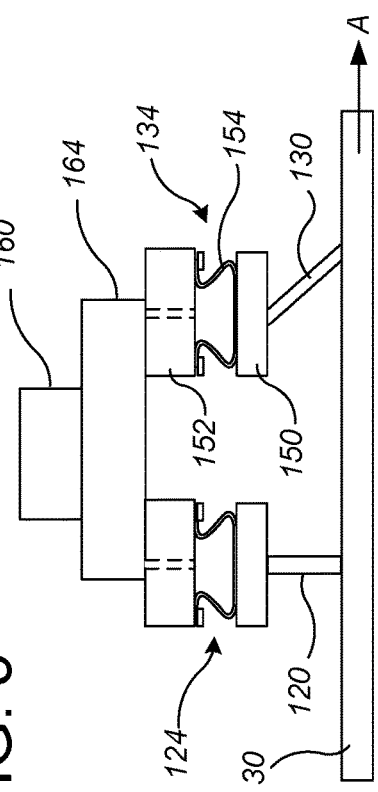
FIG. 5 is a schematic cross-sectional side view of an implementation of a slurry distribution system with actuators.

Referring to FIGS. 4 and 5, each barrier 120, 130 can be suspended from an arm 160. For example, the upper body 152 of each actuator 124, 134 can be mounted on a plate 164 that is secured to the arm 160. The arm 160 can be connected to an actuator 162 that is configured to move the arm 160 laterally across the platen 24. For example, the actuator 162 can be a rotary actuator to sweep the arm 160 in an arc (see arrow C). Although FIGS. 4 and 5 show a common arm for both barriers, there could be separate arms with separate actuators.

Figure 6:
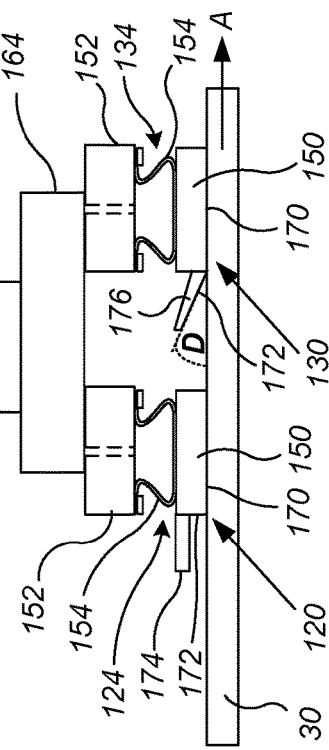
FIG. 6 is a schematic cross-sectional side view of another implementation of a slurry distribution system with actuators.

Referring to FIG. 6, rather than a separate thin wiper blade, one or both barriers 120, 130 can be provided by body having a flat lower surface 170 that extends parallel to the polishing surface and that is pressed onto the polishing pad or slightly spaced from polishing pad while still contacting the polishing liquid (e.g., hydroplaning). This body can be formed of a relatively rigid material, e.g., a ceramic, or a hard plastic such polyetheretherketone (PEEK) or polyphenylene sulfide (PPS). For example, as shown in FIG. 6, one or both barriers 120, 130 can be provided by the lower body 150 of the corresponding actuator 124, 134.

For either barrier 120, 130, the body that forms the barrier can have a leading surface 172 (on the side that the polishing pad first passes under). In some implementations, the leading surface is a vertical surface. In some implementations, the leading surface 172 will push the polishing liquid.

For either barrier 120, 130, the barrier can also include a splash guard 174 to inhibit splashing of polishing liquid that impinges the leading surface 172. The splash guard 174 can be vertically spaced from the lower surface 170 and extend horizontally from leading surface of the body in a direction opposite the direction of motion of the polishing pad rotation.

Alternatively, for either barrier 120, 130, the barrier can include a spreader 176. The spreader 176 projects from the leading surface 172 of the body and has a bottom surface that is sloped relative to the polishing surface. An angle D between the bottom surface of the spreader 176 and the polishing surface can be 15 to 75 degrees. Similar to the sloped wiper blade, the sloped bottom surface of the spreader 176 can help push fresh slurry into the grooves, thus reducing the presence of used slurry that reaches the substrate.

In some implementations, the first barrier 120 includes a splash guard and the second barrier 130 includes a spreader 176.

Returning to FIGS. 2A and 2B, the second barrier 130 can be spaced from the first barrier 120. In some implementations, the wiper blade of the second barrier 130 is oriented parallel to the wiper blade of the first barrier 120. The first barrier 120 and second barrier 130 can be the same length (along their longitudinal axis), or the second barrier 130 can be shorter than the first barrier 120. The first barrier 120 can extend entirely to the edge of the platen 24 and/or polishing pad 30, whereas the second barrier 130 can be spaced apart from the edge of the platen 24 and/or polishing pad 30.

Referring to FIG. 3, in some implementations, the dispenser 110 is positioned such that the polishing liquid 105 is delivered onto a trailing face 126 of the wiper blade of the first barrier 120. Due to the angle of the wiper blade relative to the polishing surface 36, the polishing liquid flows down the trailing face 126 and then onto the polishing pad 30 in the area between first barrier 120 and second barrier 130. An advantage of delivering the polishing liquid 105 onto the wiper blade is that the polishing liquid tends to flow laterally along the wiper blade, and thus the polishing liquid is delivered along a wider area to the polishing pad 30. Consequently, the polishing liquid can be spread more evenly across the polishing pad 30, and polishing uniformity can be improved. However, as shown in FIG. 1, in some implementations the polishing liquid 105 is dispensed directly onto the polishing pad 30 (this would be applicable to either a vertical or slanted wiper blade).

Referring to FIG. 3, in operation, the leading edge 122 of the first barrier 120 will block the used polishing liquid 105b. Most of the used polishing liquid 105b will be deflected and run off the edge of the polishing pad 30, although some of the used polishing liquid 105b in any grooves 38 in the polishing surface 38 will pass below the barrier 120.

On the other hand, fresh polishing liquid 105a will be delivered by the dispenser 110 to the area between the first barrier 120 and the second barrier 130. The fresh polishing liquid will similarly be blocked by the leading edge 132 of the second barrier 130. Depending on the flow rate and spacing between the components, fresh polishing liquid 105a might pool in the area between the first barrier 120 and the second barrier 130. However, some of the fresh polishing liquid can flow into the grooves 38, displacing the used polishing liquid 105b. As a result, significantly less used polishing liquid can reach the substrate 10, and the defects can be reduced.

Although the first barrier 120 and second barrier 130 are illustrated as separate components, they could be two walls of a connected single housing. There may be an open chamber in the middle of the housing between the two walls which can contain the polishing liquid.

As shown in FIG. 3, in some implementations, one or both barriers 120, 130, e.g., the wiper blades, can include a first portion 140 at an acute angle relative to the polishing surface 36, and a second portion 142 that is parallel to the polishing surface 36. A rounded portion 144 can connect the first portion 140 to the second portion 142. The barrier can be pre-formed in this configuration, or the barrier may be a flexible material that is initially planar but deforms into this configuration when pressed downwardly against the polishing surface 36. This configuration can help to push the fresh polishing liquid 105a into the grooves 38 to improve exchange with used polishing liquid 105b.

By blocking used slurry, the amount of polishing by-product reaching the substrate can be reduced, and thus defectivity can be reduced. In addition, without being limited to any particular theory, by increasing the amount of fresh slurry in the grooves, the concentration of inhibitor and active agent (for metal polishing) passing into contact with the substrate can be increased. This can make the polishing process less sensitive to pattern density, and dishing and erosion can be reduced. Conversely, again without being limited to any particular theory, by blocking used slurry, the concentration of copper ions can be decreased, which conserves the inhibitor for reaction with the metal surface.

Controlled positioning (shape, device dimension, pad coverage, mounting position on the pad, etc.) of the first barrier 120 and/or the second barrier 130 can be used to direct fluid off the platen 24 or towards the substrate 10 depending on the desired flow paths.

Controlled downforce on the first barrier 120 and the second barrier 130 can be used to adjust the ratio of fresh polishing liquid versus used polishing liquid flowing below the second barrier. In some implementations, the second barrier 130 is pressed against the polishing pad 30 at a lower pressure than the first barrier 120. In some implementations, the second barrier 130 is spaced higher above the polishing pad 30 than the first barrier 120.

By controlling the dispensing location or dispensing pattern of the polishing liquid using the slurry distribution system 100, the polishing profile can be adjusted and polishing uniformity can be improved.

Although the discussion above focuses on physical barriers to the polishing liquid, it would also be possible to use jets of air to block the polishing liquid. For example, an arm could extend over the polishing pad, and pressurized gas, e.g., air or nitrogen, could be directed through a slot or plurality of holes in the bottom of the arm toward the polishing pad. With proper selection of the gas flow rate, the gas could block the polishing liquid. In addition, it would also be possible to use a vacuum to suction used polishing liquid off the polishing pad; such a vacuum could be applied through a slot or plurality of holes in the bottom of the arm that extends laterally over the polishing pad.

A controller 90, e.g., a general purpose programmable digital computer, can control the flow rate of polishing liquid 105 from the reservoir, and control the actuators 124, 134 in order to control the down force and/or position of the barriers 120, 130 on the polishing pad 30. Measurements from an in-situ monitoring system can be fed to the controller 90, which can adjust polishing liquid flow rate and/or the down force of the barriers and/or position of the barriers to compensate for polishing non-uniformity.

The controller 90 can also be connected to the pressure mechanisms that control the pressure applied by carrier head 70, to carrier head rotation motor 76 to control the carrier head rotation rate, to the platen rotation motor 21 to control the platen rotation rate, or to polishing liquid distribution system 100 to control the slurry composition supplied to the polishing pad.

The polishing liquid distribution system can be used in a variety of polishing systems. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

A number of embodiments of the invention have been described. Nevertheless, it will be understood that various modifications may be made without departing from the spirit and scope of the invention. For example The leading barrier (the first barrier) could be used without the trailing barrier (the second barrier).

The trailing barrier (the second barrier) could be used in the polishing system without the leading barrier (the first barrier).

The dispenser could be supported on or an integral portion of the first barrier and/or the second barrier. For example, the dispenser could be a flexible tube supported on the first barrier.

Accordingly, other embodiments are within the scope of the following claims.

What is claimed is:

1. An apparatus for chemical mechanical polishing, comprising:
   a rotatable platen having a surface to support a polishing pad;
   a carrier head to hold a substrate in contact with the polishing pad;
   a polishing liquid distribution system, the polishing liquid distribution system including
      a dispenser positioned to deliver a polishing liquid to a portion of a polishing surface of the polishing pad, and
      a first barrier spaced apart from the dispenser and positioned over the polishing surface before the portion of the polishing surface where the dispenser is to deliver the polishing liquid and configured to block used polishing liquid being carried on the polishing surface from reaching the portion of the polishing surface, wherein the first barrier includes a solid body having a portion with a leading surface to contact the used polishing liquid, wherein the portion of the first barrier that contacts the used polishing liquid curves about an axis perpendicular to the polishing surface.

2. The apparatus of claim 1, wherein the platen is configured to rotate to provide a direction of motion below the first barrier, and the first leading surface of the first barrier is curved such that such that a concave side of the first leading surface of the first barrier faces in the direction of motion.

3. The apparatus of claim 1, comprising a second barrier spaced apart from the dispenser and positioned over the polishing surface after the portion of the polishing surface where the dispenser is to deliver the polishing liquid and configured to spread fresh polishing liquid on the polishing surface delivered by the dispenser to the portion of the polishing surface, wherein a second leading surface of the second barrier curves about an axis perpendicular to the polishing surface.

4. The apparatus of claim 3, wherein the platen is configured to rotate to provide a direction of motion below the first barrier and the second barrier, the first leading surface of the first barrier is curved such that such that a concave side of the first leading surface of the first barrier faces in the direction of motion, and the second leading surface of the second barrier is curved such that such that a concave side of the second leading surface of the second barrier faces in the direction of motion.

5. The apparatus of claim 3, wherein a radius of curvature of the second leading surface is less than a radius of curvature of the first leading surface.

6. The apparatus of claim 3, comprising a first actuator configured to adjust a height of the first barrier relative to the polishing surface and/or a pressure of the first barrier on the polishing surface, and/or a second actuator configured to independently adjust a height of the second barrier relative to the polishing surface and/or a pressure of the second barrier on the polishing surface.

7. The apparatus of claim 1, comprising a first actuator configured to adjust a height of the first barrier relative to and/or a pressure of the first barrier on the polishing surface.

8. The apparatus of claim 1, wherein the solid body has a flat bottom surface.

* * * * *

UNITED STATES PATENT AND TRADEMARK OFFICE
CERTIFICATE OF CORRECTION

PATENT NO. : 11,077,536 B2  
APPLICATION NO. : 15/626936  
DATED : August 3, 2021  
INVENTOR(S) : Yang et al.

Page 1 of 1

It is certified that error appears in the above-identified patent and that said Letters Patent is hereby corrected as shown below:

In the Claims

Column 11, Line 44, in Claim 1, after "with a", insert -- first --.

Column 12, Line 8, in Claim 2, delete "such that such that" and insert -- such that -- therefor.

Column 12, Line 23, in Claim 4, delete "such that such that" and insert -- such that -- therefor.

Column 12, Line 26, in Claim 4, delete "such that such that" and insert -- such that -- therefor.

Signed and Sealed this  
Twenty-third Day of November, 2021

Drew Hirshfeld  
*Performing the Functions and Duties of the*  
*Under Secretary of Commerce for Intellectual Property and*  
*Director of the United States Patent and Trademark Office*